United States Patent
Chang et al.

(10) Patent No.: US 11,297,733 B2
(45) Date of Patent: Apr. 5, 2022

(54) REMOVABLE FAN FLAPPER DESIGN

(71) Applicant: Quanta Computer Inc., Taoyuan (TW)

(72) Inventors: Chun Chang, Taoyuan (TW); Ta-Wei Chen, Taoyuan (TW); Shih-Wei Peng, Taoyuan (TW); Yi-Huang Chiu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/124,090

(22) Filed: Dec. 16, 2020

(65) Prior Publication Data

US 2022/0071052 A1 Mar. 3, 2022

Related U.S. Application Data

(60) Provisional application No. 63/071,162, filed on Aug. 27, 2020.

(51) Int. Cl.
*H05K 7/20* (2006.01)
(52) U.S. Cl.
CPC ..... *H05K 7/20181* (2013.01); *H05K 7/20727* (2013.01); *H05K 7/20736* (2013.01)

(58) Field of Classification Search
CPC .......... H05K 7/20181; H05K 7/20727; H05K 7/20736
See application file for complete search history.

(56) References Cited

U.S. PATENT DOCUMENTS

| | | | |
|---|---|---|---|
| 11,191,183 B1 * | 11/2021 | Lin | H05K 7/20172 |
| 2012/0156019 A1 * | 6/2012 | Gong | G06F 1/20 |
| | | | 415/182.1 |
| 2012/0162904 A1 * | 6/2012 | Chan | H05K 7/20736 |
| | | | 361/679.48 |
| 2021/0243920 A1 * | 8/2021 | Inamasa | H02M 7/003 |

* cited by examiner

*Primary Examiner* — Mukundbhai G Patel
(74) *Attorney, Agent, or Firm* — Nixon Peabody LLP

(57) ABSTRACT

A flap for a cage for holding electronic devices in a computing system is disclosed. The flap includes a main segment, a first vertical extension, a second vertical extension, a lateral ledge, and a tapered ledge. The first vertical extension and the second vertical extension extend from a first side of the main segment. The lateral ledge extends from a third side of the main segment. The tapered extensions extend from a second side of the main segment and include a flat section and an angled section. The flap has a deployed position and a stored position in the cage. The flap engages with at least two sides of the cage in the deployed or the stored position. The flap may be in the stored position when an electronic component is present. The flap blocks airflow through the cage in the deployed position.

20 Claims, 8 Drawing Sheets

REMOVABLE FAN FLAPPER DESIGN

RELATED APPLICATIONS

This application claims priority under 35 U. S. C. § 119 to U.S. Provisional Application No. 63/071,162, entitled "Removable Fan Flapper Design," and filed on Aug. 27, 2020. The contents of that application are hereby incorporated by reference in their entirety.

TECHNICAL FIELD

The present disclosure relates generally to an enclosure for a server system component, and more specifically, to a removable flap for a fan module cage that connects to the server system and promotes airflow.

BACKGROUND

Computer enclosures and other types of electronic equipment are often mounted in a vertical rack structure. Each rack structure has slots for holding the computer enclosures. Electronic equipment, such as a server, includes a chassis that contains components such as processors, power supplies, fans, and the like. The different chassis units in the rack structure may each contain multiple cages for temperature regulating devices such as fans. A typical data center may have hundreds of servers, and therefore thousands of fans.

The fans within a single chassis may be arranged on a fan wall. The fan wall may be contained within a set of cages on one end of the chassis. When the fans are not placed in the cages of the chassis, the air pressure within the chassis may change because there is a tunnel through the empty cage that allows air to leak from the chassis. The tunnel created by the empty cage may disrupt the desired airflow and potentially increase the temperature within the chassis. Thus, areas of high air pressure may be reduced by air flowing out of the chassis through the low pressure area caused by the empty cage, rather than flowing through the chassis as intended. Furthermore, dust and other particles in the air may enter the chassis through the empty cage, thereby reducing air quality and causing harm to the components in the chassis by reducing component speed or causing other damage. Speed reduction may occur from particles in the air falling on the spinning, fragile platter of a hard disk drive, which may cause some data to be lost, or make the data more difficult to access. In addition, particles may act as insulation to trap heat inside a hard disk drive and increase temperature. Therefore, there exists a need to block the vacant cages to maintain the temperature of the computing system and prevent debris from entering from vacant cages.

Flaps installed to block air flow to an empty cage can be used to decrease air leakage and protect the chassis when temperature regulating device cages are not in use. Currently, flaps typically have a gap between the open, empty cage and the flap, which allows for undesired air leakage. Additionally, current flaps may need to be removed when a temperature regulating device is installed in the cage.

Thus, there exists a need for a flap for a fan cage that minimizes air leakage. There is also a need for a flap that may be easily stored when the temperature regulating device cage is in use. There is also a need for a flap that can withstand high temperatures for prolonged periods of time.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, a flap for a cage holding electronic devices in a computing system is described. The flap includes a main segment, a first vertical extension, a second vertical extension, and a lateral ledge. The first vertical extension and the second vertical extension may extend from a first side of the main segment. The tapered extension may extend from a second side of the main segment, and may include a flat section and an angled section. The lateral ledge may extend from a third side of the main segment.

According to a configuration of the above implementation, the tapered extension may also include a circular end coupled to the angled section.

According to another configuration of the above implementation, the lateral ledge may also include a perpendicular member.

In a further aspect of the above implementation, the cage includes a first panel, a second panel, and a third panel. The first panel and the second panel are perpendicularly connected to the third panel, and the first panel is approximately parallel to the second panel. A side of the angled section of the flap engages with the first panel of the cage; the main segment of the flap abuts the third panel of the cage; and the second vertical extension of the flap abuts the second panel of the cage in a deployed position. Furthermore, the main segment, the lateral ledge, and the tapered extension of the flap are positionable within the cage, and the first vertical extension of the flap abuts the third panel of the cage in a stored position.

In another aspect of the above implementation, the flap blocks airflow through the cage in the deployed position.

According to another configuration of the above implementation, the flap is in the stored position when an electronic component is present.

In a further aspect of the above implementation, the flap is metal.

In yet a further aspect of the above implementation, the flap is plastic.

Another aspect of the present disclosure includes a cage for holding an electronic device. The cage includes a top wall, a bottom wall, and two side walls. The top wall and the bottom wall are perpendicularly connected to the side walls. The top wall is approximately parallel to the bottom wall. The cage also includes a flap. The flap has a main segment connected to a first vertical extension, a second vertical extension, a lateral ledge, and a tapered extension. The first vertical extension and the second vertical extension extend from a first side of the main segment. The tapered extension extends from a second side of the main segment and includes a flat section and an angled section. The lateral ledge extends from a third side of the main segment. The tapered extension is configured to abut one of the side walls of the cage.

According to a configuration of the above implementation, the tapered extension also includes a circular end coupled to the angled section.

According to another configuration of the above implementation, the lateral ledge also includes a perpendicular member.

In a further aspect of the above implementation, a side of the angled section of the flap engages with the top wall of the cage; the main segment of the flap abuts the two side walls of the cage; and the second vertical extension of the flap abuts the bottom wall of the cage in a deployed position. Furthermore, the main segment, the lateral ledge, and the tapered extension of the flap are positionable within the cage, and the first vertical extension of the flap abuts the two side walls of the cage in a stored position.

In another aspect of the above implementation, the flap blocks airflow through the cage in the deployed position.

According to another configuration of the above implementation, the flap is in the stored position when an electronic component is present.

In a further aspect of the above implementation, the flap is metal.

In yet a further aspect of the above implementation, the flap is plastic.

Another aspect of the present disclosure includes a computing device. The computing device includes a plurality of cages for holding electronic devices. Each cage includes a top wall, a bottom wall, and two side walls. The top wall and the bottom wall are perpendicularly connected to the side walls. The top wall is approximately parallel to the bottom wall. The device also includes a flap. The flap has a main segment connected to a first vertical extension, a second vertical extension, a lateral ledge, and a tapered extension. The first vertical extension and the second vertical extension extend from a first side of the main segment. The lateral ledge extends from a third side of the main segment. The tapered extension extends from a second side of the main segment and includes a flat section and an angled section. The flap engages the two side walls of one of the cages in a stored position. The flap engages the top wall, the bottom wall, and the two sides walls of one of the cages in a deployed position.

According to a configuration of the above implementation, the tapered extension also includes a circular end coupled to the angled section.

According to another configuration of the above implementation, the lateral ledge also includes a perpendicular member.

In another aspect of the above implementation, the flap blocks airflow through one of the cages in the deployed position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
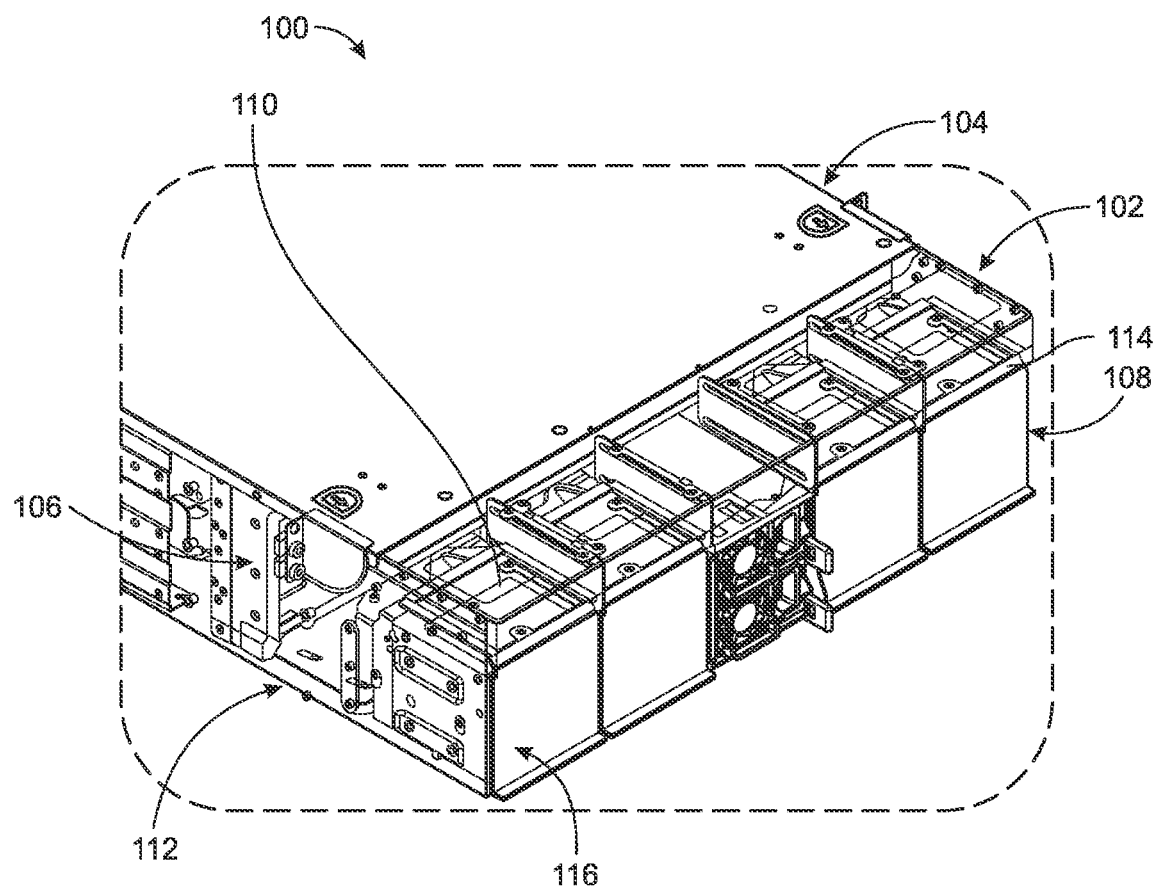
FIG. 1 is a perspective view of a computing system with example flaps inserted in fan cages of the chassis of the computing system.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed to a flap for a temperature regulating device in a cage that, among other benefits, provides for easy installation and removal of the flap from the cage, permits increased airflow into a chassis system, and may be reused multiple times.

FIG. 1 illustrates a computing system such as a server system 100 having a fan wall 102, a chassis 104, and a power supply 106. In other implementations, the server system 100 may include more than the listed components or less than the listed components. In some implementations, the fan wall 102 is made up of a set of cages 108. In some implementations, the cages 108 are located horizontally between a first panel 110 and a second panel 112, both of which are approximately parallel from each other. Thus, the first panel 110 may make up a top part of the cage 108, and the second panel 112 may make up a bottom part of the cage 108. The cages 108 may also include a third panel 114, which is approximately perpendicular to the first panel 110 and the second panel 112. Thus, the third panel 114 may make up a front part of the cage 108. Two side parts of the cage 108 may be defined by partitions connected to the first panel 110 and the second panel 112. In some implementations, the cages 108 are considered slots, holders, containers, receptacles, slits, apertures, or openings. The cages 108 are vertically positioned next to each other along the length of the first panel 110 and the second panel 112. As shown in FIG. 1, the cages 108 may include flaps, such as the flaps 116, to block air flow if a fan is not inserted in the cage 108.

In some implementations, the cages 108 may include other devices of different sizes to serve the function of generating air flow thereby regulating temperature within the server system 100, including directing air flow between the components of the server system 100. Thus, the airflow in the server system 100 may be modified to optimize the temperature in the server system 100. In some implementations, the other devices in the cages 108 may include temperature regulating devices, including fans, heat sinks, thermal compounds, liquid cooling systems, or immersion cooling systems. In other implementations, the cages 108 may be empty and thus have the flaps 116 inserted to block airflow through the empty cage 108, as will be explained herein.

As previously described, an empty cage 108 may decrease the air pressure and air quality that may damage electronic equipment in the server system 100. Inserting a deployed flap 116 or a temperature regulating device, such as a fan module in the cage 108 decreases the aforementioned risk.

Figure 2A:
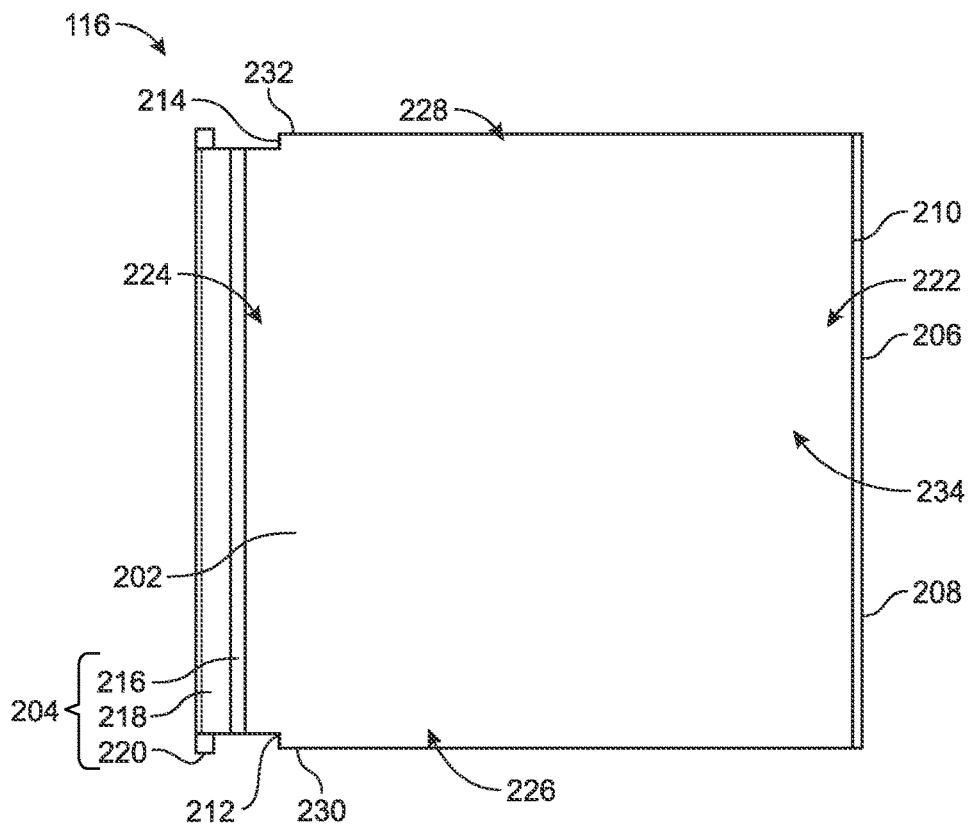
FIG. 2A is a top plan view of the example flap removed from the computing system.
Figure 2B:
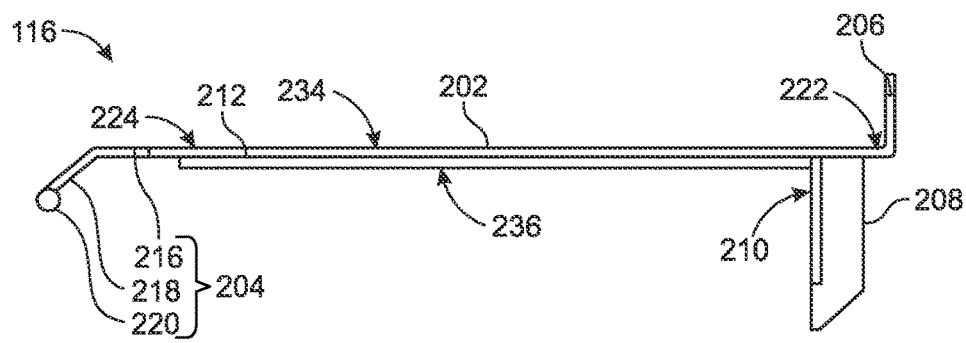
FIG. 2B is a front view of the example flap of FIG. 2A.
Figure 2C:
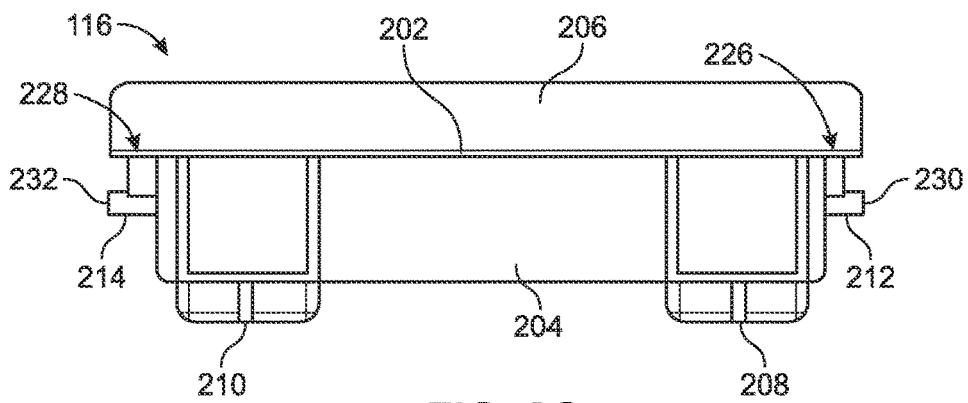
FIG. 2C is a side view of the example flap of FIG. 2B.

FIG. 2A is a top plain view of one of the flaps 116. FIG. 2B shows a front view, and FIG. 2C shows a side view of the flap 116 of FIG. 2A. The flap 116 is an example of the flaps that may be placed over the cages 108 in FIG. 1.

In this example, the flap 116 is fabricated from a flexible, malleable, insulative, heat resistant material. In this example, the flap 116 is made of a compound plastic, such as Polycarbonate or Acrylonitrile-Butadiene-Styrene. In other implementations, the flap 116 may be made of sheet metal, such as hot dip galvanized steel (SGCC). The material of the flap 116 may allow for the flap 116 to bend, or otherwise temporarily deform, while maintaining its structural integrity.

As shown in FIG. 2A, the flap 116 may include a main segment 202, which has first side 222, a second side 224, a third side 226, a fourth side 228, a fifth side 234, and a sixth side 236 (FIG. 2B). A first vertical extension 206 may extend from an intersection of the first side 222 and the fifth side 234 of the main segment 202. A second vertical extension 208 may extend from an intersection of the first side 222 and the sixth side 236 (FIG. 2B) of the main segment 202, and a third vertical extension 210 may extend from another intersection of the first side 222 and the sixth side 236 (FIG. 2B) of the main segment 202. A tapered extension 204 may extend from the second side 224 of the main segment 202. In some implementations, the tapered extension 204 may include a flat section 216, an angled section 218, and a circular end 220. A first lateral ledge 212 may extend from the third side 226 of the main segment 202. A second lateral ledge 214 may extend from the fourth side 228 of the main segment 202. In some implementations, the first lateral ledge 212 may be connected to a first perpendicular member 230. In some implementations, the second lateral ledge 214 may be connected to a second perpendicular member 232.

Referring to FIGS. 2A-2C, in some implementations, the first vertical extension 206 extends at an approximately 90-degree angle in an upward direction from the first side 222 of the main segment 202. The components at the top of FIG. 2B are in an upward direction, and the components at the bottom of FIG. 2B are in an opposite, downward direction. In some implementations, the first side 222 of the main segment 202 may also be connected to the second vertical extension 208 and the third vertical extension 210 at a different point of the main segment 202. As shown in FIGS. 2B-2C, the second vertical extension 208 and third vertical extension 210 extend at an approximately 90-degree angle in a downward direction, where the second vertical extension 208 and the third vertical extension 210 are approximately parallel.

Referring to FIGS. 2A-2B, in some implementations, the second side 224 of the main segment 202 may be connected to one edge of the tapered extension 204. In some implementations, the tapered extension 204 may include the flat section 216 connected to the angled section 218, where the angled section 218 is angled downward at an approximately 41.4-degree angle in a fixed position. The angled section 218 may bend when force is applied to it such that the downward angle of the angled section 218 may be greater than or less than 41.4-degrees when the flap 116 is in transition between a stored position or a deployed position. In either the deployed position or in the stored position, the angled section 218 may be angled downward at an angle of approximately 41.4-degrees. In some implementations, the angled section 218 may include a circular end 220 opposite the connection between the flat section 216 and the angled section 218. As illustrated, the circular end 220 may include a circular cross-section. In some implementations, the cross-section of the circular end 220 may include other shapes such as an oval, an ellipse, or an arch.

Referring to FIG. 2C, in some implementations, the first lateral ledge 212 may extend from the third side 226 of the main segment 202. The first perpendicular member 230 may extend from the first lateral ledge 212 at an approximately 90-degree angle. The first perpendicular member 230 may be connected to the first lateral ledge 212 at an opposite side of the connection between the first lateral ledge 212 and the main segment 202.

In some implementations, the second lateral ledge 214 may extend from the fourth side 228 of the main segment 202. The second perpendicular member 232 may extend from the second lateral ledge 214 at an approximately 90-degree angle. The second perpendicular member 232 may be connected to the second lateral ledge 214 at an opposite side of the connection between the second lateral ledge 214 and the main segment 202.

It should be understood that there may be greater or fewer than three vertical extensions on the flap 116. It should also be understood that there may be greater or fewer than two sections of the tapered extension 204 on the flap 116 as illustrated. It should also be understood that there may be greater or fewer than two perpendicular members on the flap 116 as illustrated.

Figure 3:
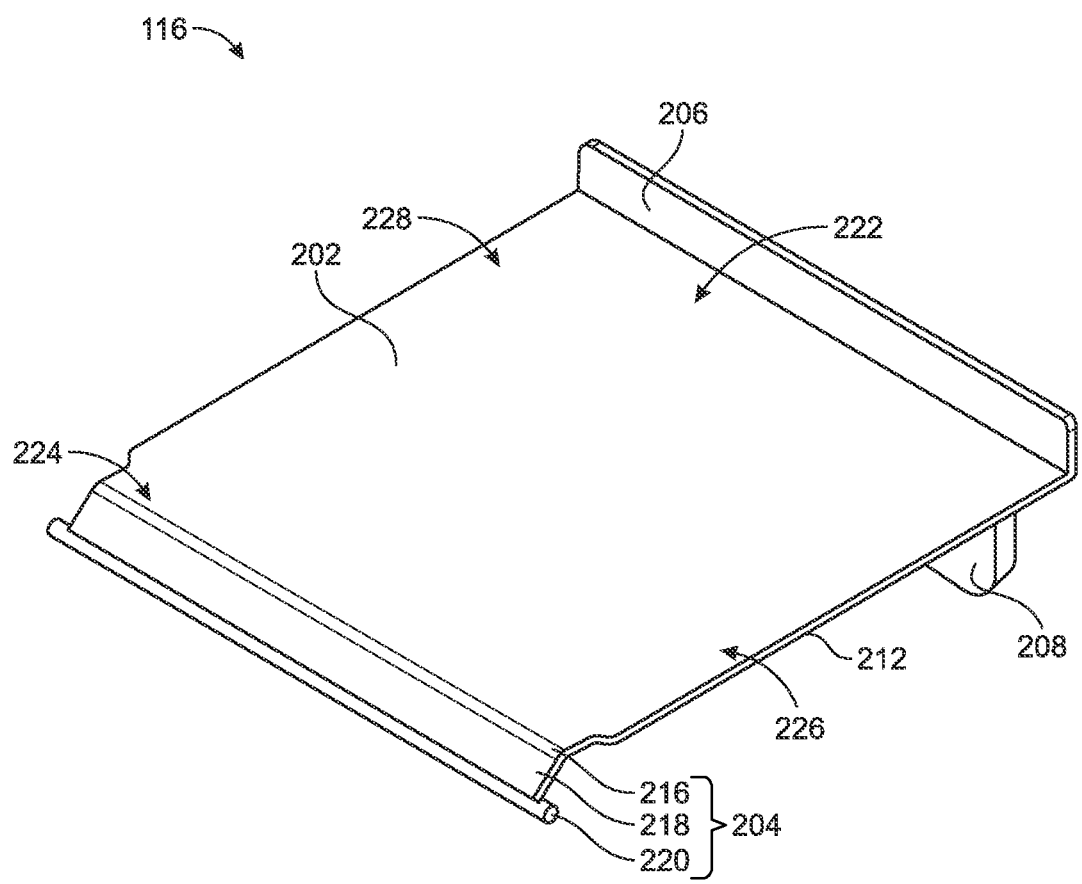
FIG. 3 is a perspective view of the example flap of FIGS. 2A-2C.

FIG. 3 is perspective view of the example flap 116 shown in FIGS. 2A-2C. Like elements in FIGS. 1-2 are labeled with the same reference numbers in FIG. 3. As illustrated, the flap 116 may include the first vertical extension 206, second vertical extension 208, and the third vertical extension 210 (shown in FIGS. 2A-2C) that may provide stability and security for the flap 116 when the flap 116 is in the stored position or the deployed position. In some implementations, the flap 116 may also include the second vertical extension 208 and the third vertical extension 210 (shown in FIGS. 2A-2C) for the function of stability and security for the flap 116 when the flap 116 is in the deployed position. In some implementations, the flap 116 may also include the tapered extension 204 to enhance the ability of the flap 116 in transition from the stored position to the deployed position, while maintaining contact with the cage 108 (shown in FIG. 1).

Figure 4A:
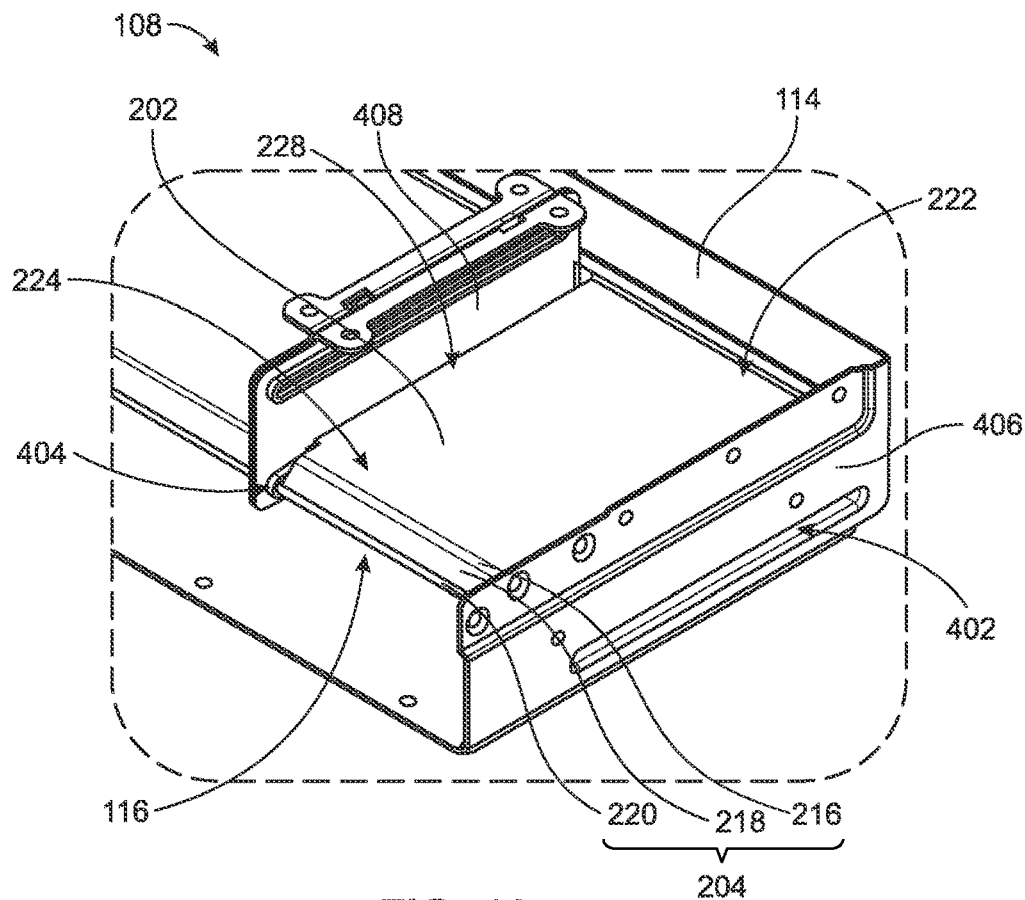
FIG. 4A is a perspective bottom view of another example flap in a stored position.
Figure 4B:
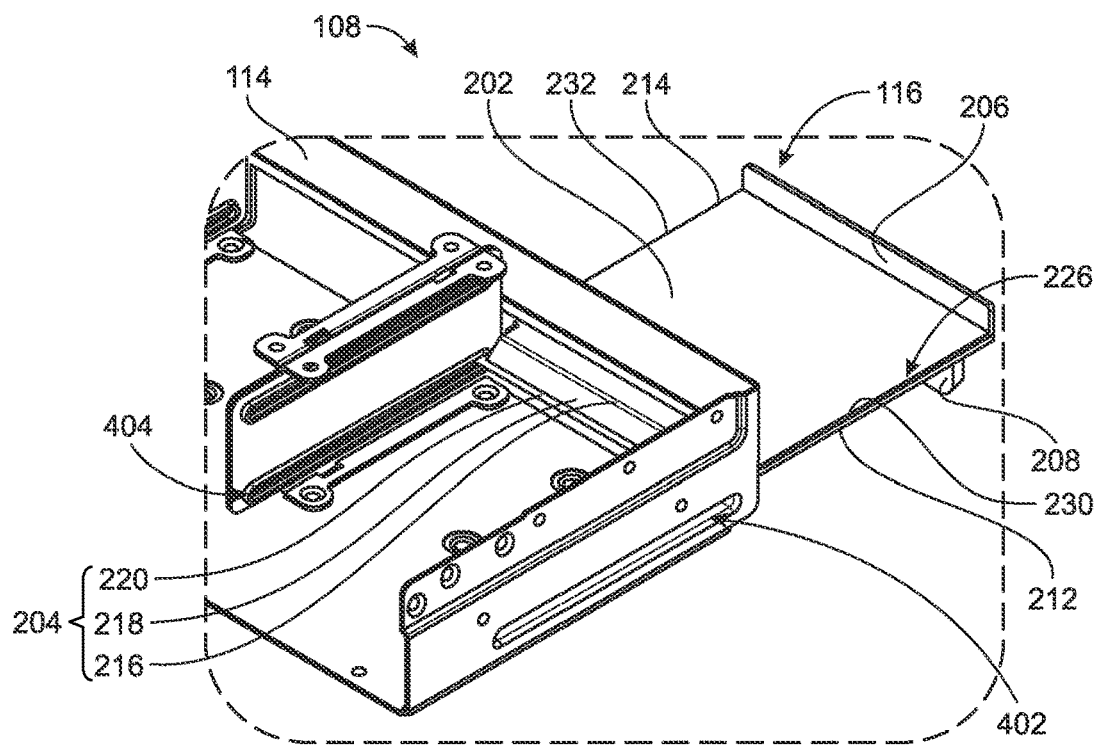
FIG. 4B is a perspective bottom view of the example flap of FIG. 4A being removed from a cage.

FIG. 4A is a perspective bottom view of the flap 116 in a stored position relative to a cage, which is one of the cages 108 (shown in FIG. 1). FIG. 4B is a perspective view of the flap 116 being removed from the cage 108 from the stored position shown in FIG. 4A. Each cage contains at least three defining walls. As illustrated in FIG. 4A, a side part of the cage 108 may be defined by an end wall 406. The end wall 406 may be located at an end of the server system 100 (shown in FIG. 1). As illustrated, another side part of the cage 108 may be defined by a partition 408. As illustrated, a front part may be defined by the third panel 114. The end wall 406 may include a first rail 402. The partition 408 may include a second rail 404. The first rail 402 and the second rail 404 may be approximately parallel to each other and perpendicular to the third panel 114. The first side 222 of the main segment 202 is located near the third panel 114 in the stored position. The second side 224 of the main segment 202 is located furthest from the third panel 114 in the stored position. In some implementations, the third side 226 (shown in FIG. 4B) of the main segment 202 may be located near the first rail 402. As illustrated, the fourth side 228 of the main segment 202 is located near the second rail 404.

The tapered extension 204 includes the flat section 216, the angled section 218, and the circular end 220. The tapered extension 204 is located near the second side 224 of the main segment 202, and at a location furthest from the third panel 114. As illustrated, the first rail 402 and the second rail 404 extend horizontally across the side panel of the cage 108 in order to engage the flap 116. Thus, the main segment 202, the flat section 216, the angled section 218, and the circular end 220 may all fit into the first rail 402 and the second rail 404 such that the angled section 218 bends approximately at an angle between 0 and 45 degrees downward. The tapered extension 204 may be approximately flat and planar with the main segment 202 in the stored position. In some implementations, the first vertical extension 206 (shown in FIG. 4B) may abut the third panel 114 in the stored position shown in FIG. 4A.

FIG. 4B shows the position of the flap 116 when the flap 116 is initially installed into the cage 108, before it reaches the stored position shown in FIG. 4A. This is also the position of the flap 116 being removed from the cage 108 after it was in a deployed position. The first rail 402 and the second rail 404 engage with the first lateral ledge 212 and the second lateral ledge 214, respectively, in the stored position. The first rail 402 may engage with the first perpendicular member 230 of the first lateral ledge 212. The second rail 404 may engage with second perpendicular member 232 of the second lateral ledge 214. The tapered extension 204 of the flap 116 may bend such that the downward angle of the angled section 218 is less than 41.4-degrees when being removed from the first rail 402 and the second rail 404. The tapered extension 204 may bend to match the shape of the first rail 402 and the second rail 404. Thus, in some implementations, the flap 116 does not affect airflow within the system 100 (shown in FIG. 1) while in the stored position, regardless of whether there is a device, such as a fan, in the cage 108, or whether the cage 108 is empty. As illustrated, the first vertical extension 206 of the flap 116 moves away from the cage 108 when force is applied. The applied force moves the flap 116 from the stored position in FIG. 4A to the transition position shown in FIG. 4B. In some implementations, the force may be applied using a tool or by a user's finger or multiple fingers.

Figure 5:
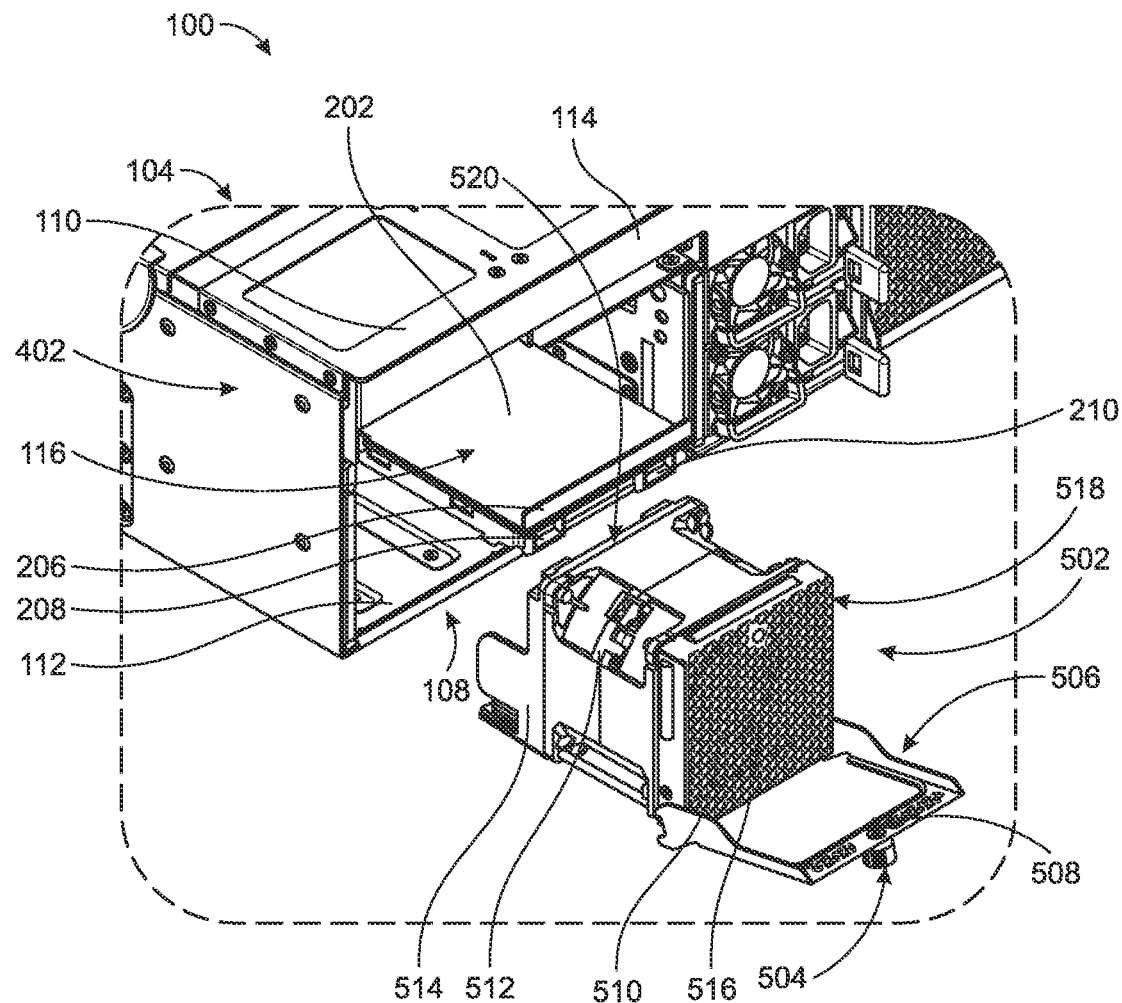
FIG. 5 is a perspective view of a server system with an example flap in transition from a stored position to a deployed position after a fan module has been removed from the server system.

FIG. 5 is a perspective view of a cage 108 of the server system 100, with the flap 116 in transition from the stored position to the deployed position, after a fan module 502 has been removed from one of the cages 108 of the system 100. The cages 108 may hold only fan modules 502, only flaps 116, or both a fan module 502 and a flap 116. In other implementations, the cages 108 may also hold other devices, such as temperature regulating devices. In other implementations, the cages 108 may be empty. The fan module 502 may include a screw 504, a lever 506, a knob 508, and a front grill 510. The fan module 502 may also include other components such as a motor 512, a locking mechanism 514, and fan blades 516. The screw 504 and the lever 506 may work in conjunction with the front grill 510 to direct airflow through the chassis 104. The fan module 502 may also be rectangular in shape, including a front frame 518 and a back frame 520 that are generally parallel. The fan module 502 may be configured to fit inside a cage, such as the cage 108, and secured in place by components extending from the front frame 518 to the back frame 520. The lever 506 may be moved to an extended position when the fan module 502 is removed from the cage 108. In the extended position, the lever 506 is pulled away from the fan module 502. When the lever 506 is in the extended position, the locking mechanism 514 of the fan module 502 releases contact with the cage 108 in order to release the fan module 502. The fan module 502 can be removed from the cage 108, and the flap 116 can be installed into the cage 108. The main segment 202 of the flap 116 is approximately parallel to the first panel 110 of the cage 108. The first vertical extension 206, the second vertical extension 208, and the third vertical extension 210 of the flap 116 are approximately parallel to the third panel 114 of the cage 108. In some implementations, when the flap 116 is fully inserted into the cage 108, the flap 116 may be in the stored position.

Figure 6A:
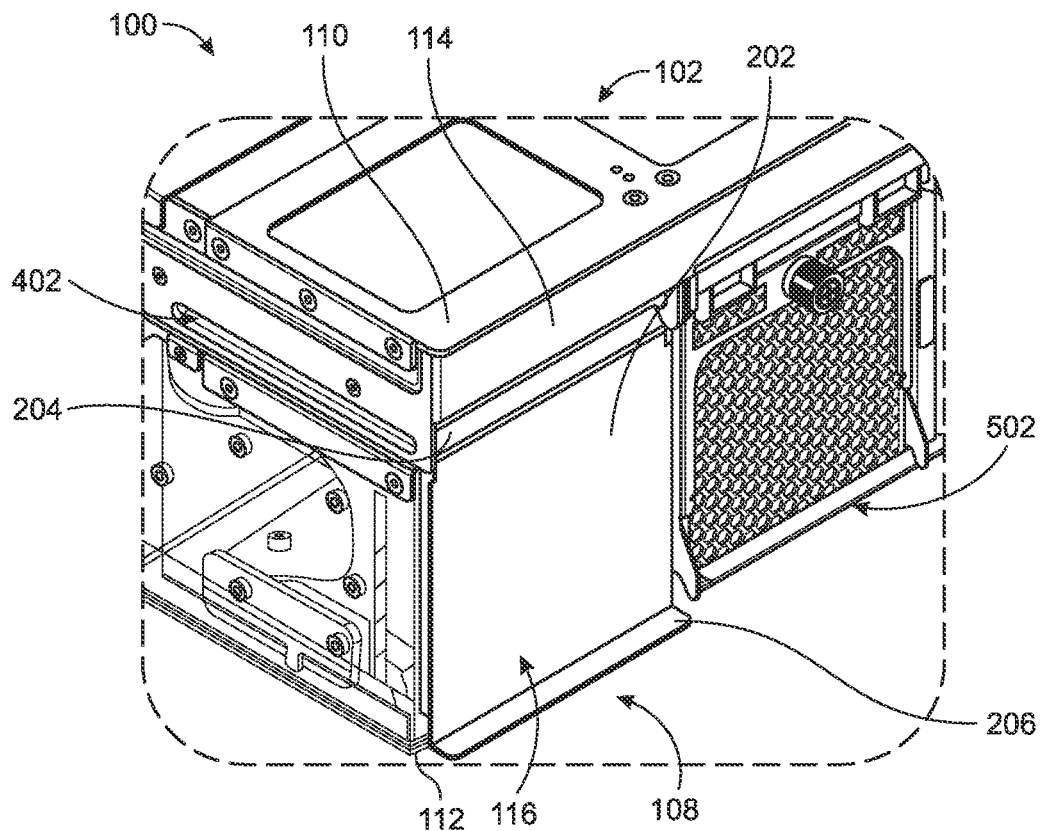
FIG. 6A is a perspective view of a server system with an example flap in a deployed position.

FIG. 6A is a perspective view of the server system 100 with the flap 116 in a deployed position in one of the cages 108 in the fan wall 102. As illustrated, the main segment 202 is in a position approximately parallel to the third panel 114 of the cage 108 in the deployed position. The first vertical extension 206 is approximately parallel to the first panel 110 and the second panel 112 of the cage 108. Another cage 108 holds the fan 502.

In the deployed position shown in FIG. 6A, the tapered extension 204 of the flap 116 may allow for the flap 116 to maintain its engagement with the first rail 402 and the second rail 404 (shown in FIGS. 4A-4B). More specifically, the end of the circular end 220 of the tapered extension 204 maintain engagement with the first rail 402 and the second rail 404 (shown in FIGS. 4A-4B) in the deployed position. More specifically, the second vertical extension 208 and the third vertical extension 210 (both shown in FIG. 6B) may abut the second panel 112 of the cage 108. In some implementations, the deployed position of the flap 116 prevents air from leaking and disrupting the airflow within the system 100 so that the devices of the fan wall 102 may maintain an optimal pressure and temperature within the system 100 when a cage 108 is empty. In the deployed position, the flap 116 may cover or enclose the entirety of the exposed, vacant cage 108. Thus, in some implementations, the flap 116 in the deployed position may block, and thereby minimize, airflow out of the cage 108.

Figure 6B:
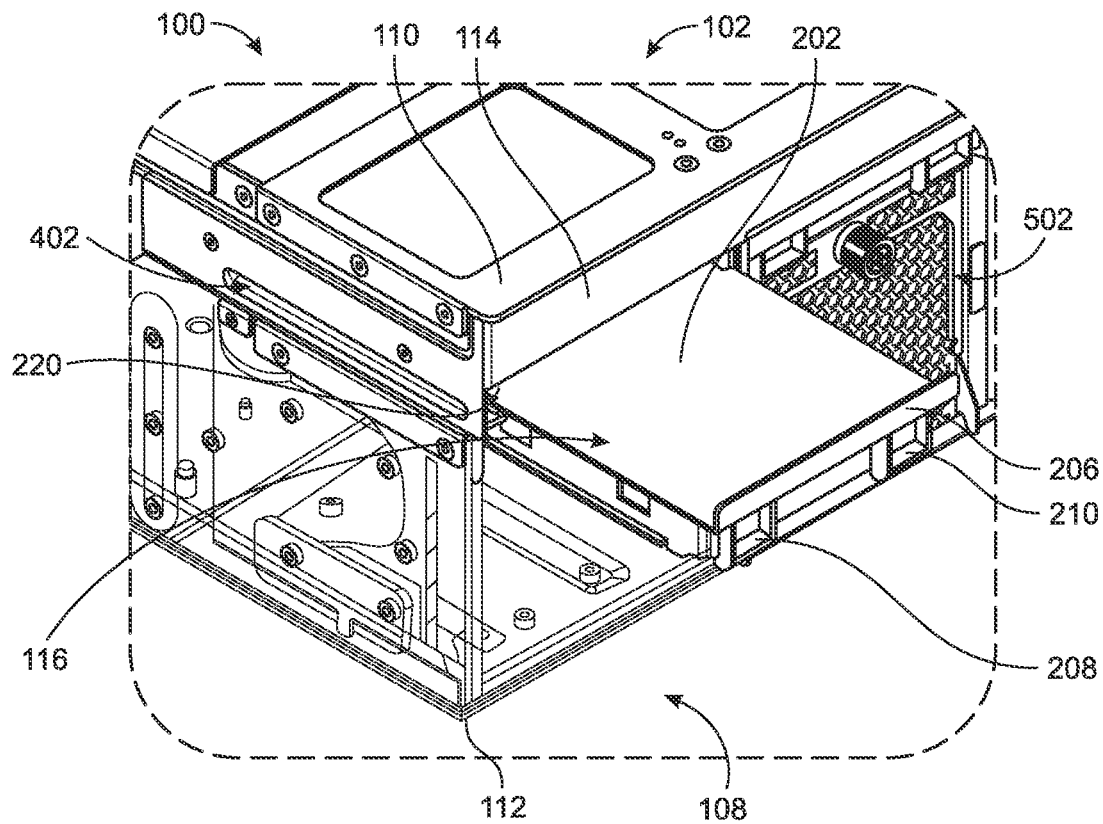
FIG. 6B is a perspective view of a server system with the example flap of FIG. 6A in transition from a deployed position to a stored position.

FIG. 6B is a perspective view of the server system 100 with the flap 116 in transition from the deployed position to the stored position. In some implementations, the flap 116 may start in the deployed position shown in FIG. 6A, and be rotated approximately 90-degrees upward about the circular end 220 to the position shown in FIG. 6B. After such rotation, the main segment 202 of the flap 116 is approximately parallel to the first panel 110 of the cage 108. Additionally, after such rotation, the first vertical extension 206, the second vertical extension 208, and the third vertical extension 210 are approximately parallel to the third panel 114 of the cage 108. In rotating the flap 116 from the deployed position to the transition position shown in FIG. 6B, the tapered extension 204 (shown in FIG. 6A) may maintain its engagement with the first rail 402 and the second rail 404 (shown in FIGS. 4A-4B). In some implementations, the flap 116 may be rotated by a tool or by a user's finger or multiple fingers. In some implementations, the circular end 220 allows the flap 116 to be rotated within the first rail 402 and the second rail 404 (shown in FIGS. 4A-4B) without having to be removed. In some implementations, the material of the flap 116 allows for the flap 116 to be rotated and maintain its structural integrity. From the position shown in FIG. 6B, the flap 116 may be removed from the cage 108; installed into the cage 108 in the stored position; or returned to the deployed position.

Figure 7A:
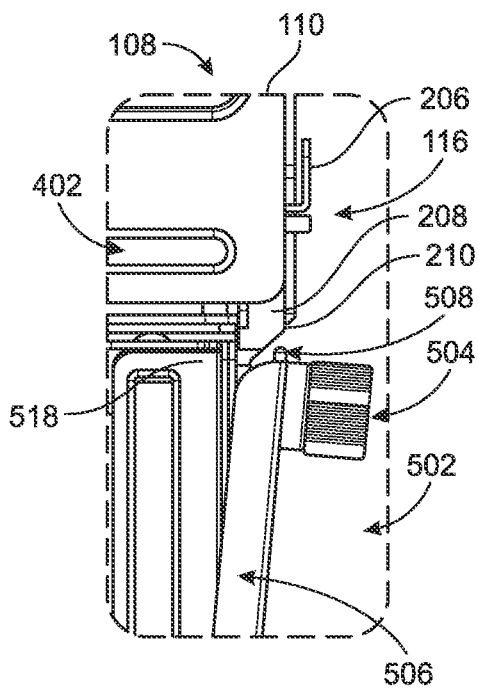
FIG. 7A is a close-up, side view of an example flap and a fan module in a first position while in transition into a stored position.
Figure 7B:
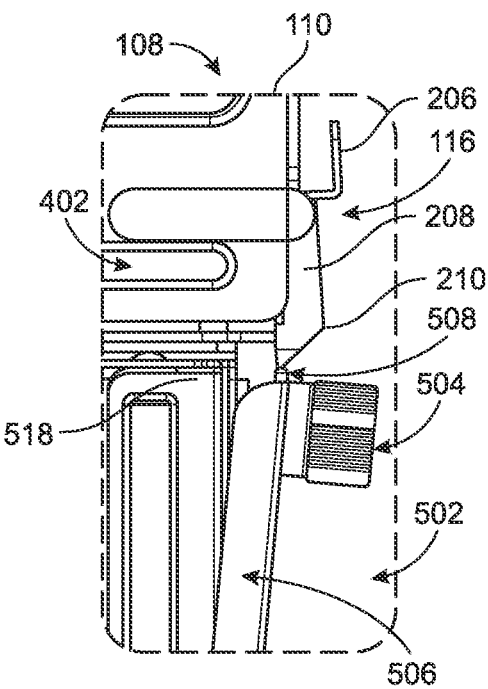
FIG. 7B is a close-up, side view of the example flap and fan module of FIG. 7A in a second position while in transition into a stored position.
Figure 7C:
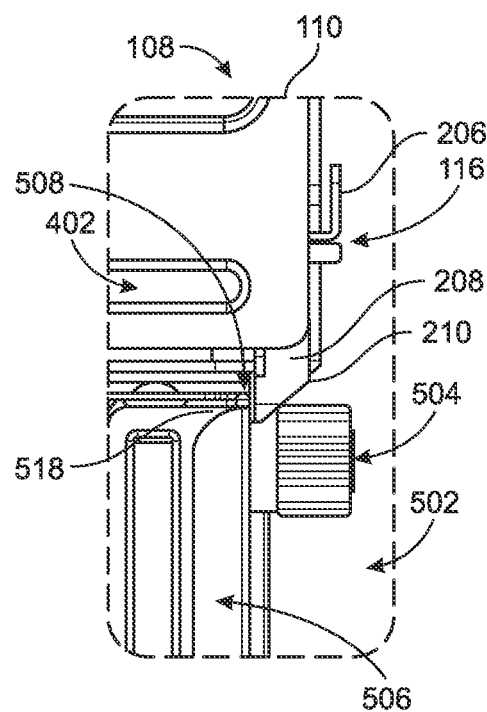
FIG. 7C is a close-up, side view of the example flap and fan module of FIG. 7B in a stored position.

FIGS. 7A-7C are close-up, side views of the flap 116 and the fan module 502 installed in the cage 108 while the flap 116 is in transition into the stored position. In some implementations, the flap 116 may be in the stored position shown in FIGS. 7A-7C when both the fan module 502 and the flap 116 are in the cage 108. In other implementations, only the flap 116 may be in the cage 108 in the stored position. As illustrated, after the flap 116 is installed into the cage 108 and is in the stored position, the fan module 502 may be inserted into the cage 108. The fan module 502 moves from the extended position shown in FIG. 5 into the cage 108 as shown in FIGS. 7A-7C. Once in the cage 108, the fan module 502 moves from the extended position to a contracted position, as shown in FIG. 7A-7C. In the contracted position, the lever 506 is pulled toward the fan module 502 as shown in FIG. 7C.

As illustrated in FIG. 7A, the second vertical extension 208 and the third vertical extension 210 may be closer to the front frame 518 than the knob 508 of the lever 506 of the fan module 502. The lever 506 of the fan module 502 may be moved to the extended position when the fan module 502 is removed from the cage 108. Thus, the lever 506 may also be in the extended position when the fan module 502 is initially installed into the cage 108. As shown in FIG. 7A, the lever 506 of the fan module 502 moves closer to the front frame 518 in transition to storing the fan module 502 in the cage 108.

As illustrated in FIG. 7B, the first vertical extension 206, the second vertical extension 208, and the third vertical extension 210 are moved in the upward direction, toward the first panel 110. During the movement upward, the flap 116 maintains engagement with the first rail 402 and the second rail 404 (shown in FIGS. 4A-4B). Thus, in some implementations, a force may be applied upon the first vertical extension 206, the second vertical extension 208, and the third vertical extension 210 in the upward direction sufficient for the knob 508 on the lever 506 to abut the fan module 502. In some implementations, the force may be applied using a tool or by a user's finger or multiple fingers.

FIG. 7C shows the flap 116 and fan module 502 in the stored position. As illustrated, in the stored position, the knob 508 of the lever 506 of the fan module 502 is closer to the front frame 518 than the second vertical extension 208 and the third vertical extension 210. In some implementations, the second vertical extension 208 and the third vertical extension 210 abut the lever 506 of the fan module 502 in a stored position of the flap 116. FIG. 7C illustrates the fan module 502 being fully secured in the cage 108.

Figure 8:
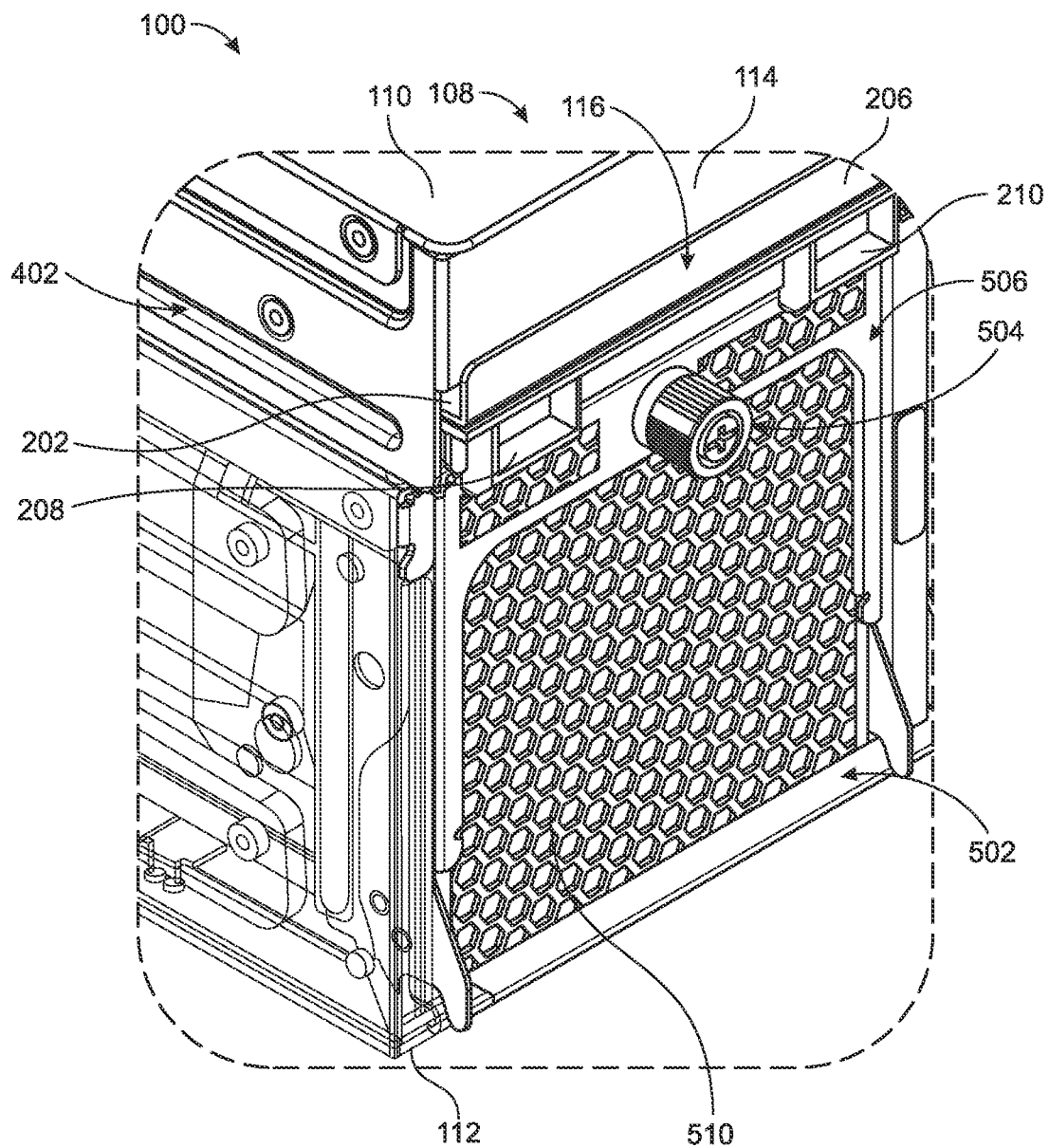
FIG. 8 is a perspective view of a server system with an example flap in a stored position with a fan module in a system.

FIG. 8 is a perspective view of one of the cages 108 of the server system 100 with the flap 116 in the stored position when the fan module 502 is seated in the cage 108. As illustrated, the first vertical extension 206, the second vertical extension 208, and the third vertical extension 210 are approximately parallel to the lever 506 of the fan module 502 and the third panel 114 of the cage 108. In some implementations, the main segment 202 is approximately parallel to the first panel 110 and the second panel 112 of the cage 108. In the stored position with the fan module 502 installed, the flap 116 is stored away. Thus, the stored flap 116 allows the fan module 502 to be held in the cage 108. From this position, the fan module 502 may be uninstalled, and the flap 116 may transition into the deployed position to block airflow out of the vacant cage 108.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A flap for a cage holding electronic devices in a computing system, the flap comprising:
   a main segment;
   a first vertical extension and a second vertical extension extending from a first side of the main segment;
   a tapered extension extending from a second side of the main segment, with a flat section and an angled section; and
   a lateral ledge extending from a third side of the main segment.

2. The flap of claim 1, wherein the tapered extension further comprises a circular end coupled to the angled section.

3. The flap of claim 1, wherein the lateral ledge further comprises a perpendicular member.

4. The flap of claim 1, wherein the cage includes a first panel, a second panel, and a third panel, wherein the first panel and the second panel are perpendicularly coupled to the third panel, and the first panel is approximately parallel to the second panel, wherein:
   (i) a side of the angled section of the flap engages the first panel of the cage, the main segment of the flap abuts the third panel of the cage, and the second vertical extension of the flap abuts the second panel of the cage in a deployed position; and
   (ii) the main segment, the lateral ledge, and the tapered extension of the flap are positionable within the cage, and the first vertical extension of the flap abuts the third panel of the cage in a stored position.

5. The flap of claim 4, wherein the flap blocks airflow through the cage in the deployed position.

6. The flap of claim 4, wherein the flap is in the stored position when an electronic component is present in the cage.

7. The flap of claim 1, wherein the flap is metal.

8. The flap of claim 1, wherein the flap is plastic.

9. A cage assembly for holding an electronic device, the cage assembly comprising:
   a top wall;
   a bottom wall;
   two side walls, wherein the top wall and the bottom wall are perpendicularly coupled to the side walls, and wherein the top wall is approximately parallel to the bottom wall; and
   a flap having a main segment coupled to a first vertical extension, a second vertical extension, a lateral ledge, and a tapered extension, wherein:
      the first vertical extension and the second vertical extension extend from a first side of the main segment;
      the tapered extension extends from a second side of the main segment and includes a flat section and an angled section; and
      the lateral ledge extends from a third side of the main segment, wherein the tapered extension is configured to abut one of the side walls of the cage.

10. The cage assembly of claim 9, wherein the tapered extension further comprises a circular end coupled to the angled section.

11. The cage assembly of claim 9, wherein the lateral ledge further comprises a perpendicular member.

12. The cage assembly of claim 9, wherein:
   (i) a side of the angled section of the flap engages the top wall of the cage, the main segment of the flap abuts the two side walls of the cage, and the second vertical extension of the flap abuts the bottom wall of the cage in a deployed position; and
   (ii) the main segment, the lateral ledge, and the tapered extension of the flap are positionable within the cage, and the first vertical extension of the flap abuts the two side walls of the cage in a stored position.

13. The cage assembly of claim 12, wherein the flap blocks airflow through the cage in the deployed position.

14. The cage assembly of claim 12, wherein the flap is in the stored position when an electronic component is present.

15. The cage assembly of claim 9, wherein the flap is metal.

16. The cage assembly of claim 9, wherein the flap is plastic.

17. A computing device comprising:
   a plurality of cages for holding electronic devices, each of the plurality of cages including:
   a top wall;
   a bottom wall; and
   two side walls, wherein the top wall and the bottom wall are perpendicularly coupled to the side walls, and the top wall is approximately parallel to the bottom wall; and
   a flap having a main segment coupled to a first vertical extension, a second vertical extension, a lateral ledge, and a tapered extension, wherein:
      the first vertical extension and the second vertical extension extend from a first side of the main segment;
      the tapered extension extends from a second side of the main segment and includes a flat section and an angled section;
      the lateral ledge extends from a third side of the main segment;
      the flap engages the two side walls of one of the cages in a stored position; and the flap engages the top wall and the bottom wall, and the two sides walls of one of the cages in a deployed position.

18. The device of claim 17, wherein the tapered extension further comprises a circular end coupled to the angled section.

19. The device of claim 17, wherein the lateral ledge further comprises a perpendicular member.

20. The device of claim 17, wherein the flap blocks airflow through one of the cages in the deployed position.

* * * * *